United States Patent
Karioja et al.

(10) Patent No.: US 6,192,059 B1
(45) Date of Patent: Feb. 20, 2001

(54) WAVELENGTH-TUNABLE LASER CONFIGURATION

(75) Inventors: Pentti Karioja, Oulu (FI); Yakov Sidorin, Mountain View, CA (US)

(73) Assignees: Valtion Teknillinen Tutkimmuskeskus, Vtt (FI); Board of Regents on Behalf of Optical Sciences Center, Tucson, AZ (US)

(*) Notice: Under 35 U.S.C. 154(b), the term of this patent shall be extended for 0 days.

(21) Appl. No.: 09/293,064

(22) Filed: Apr. 16, 1999

(30) Foreign Application Priority Data

Apr. 17, 1998 (FI) .................................................. 980860

(51) Int. Cl.[7] ........................................................ H01S 3/10
(52) U.S. Cl. ......................... 372/20; 372/32; 372/9; 372/92
(58) Field of Search ............................. 372/20, 32, 102, 372/92, 9, 33; 359/248, 291; 356/328; 310/309

(56) References Cited

U.S. PATENT DOCUMENTS

| | | | |
|---|---|---|---|
| 4,556,979 | 12/1985 | Scott et al. | 372/20 |
| 4,825,262 * | 4/1989 | Mallinson | 356/352 |
| 5,022,745 * | 6/1991 | Zayhowski et al. | 350/607 |
| 5,291,502 * | 3/1994 | Pezeshkietal | 372/20 |
| 5,572,543 | 11/1996 | Heinemann et al. | 372/92 |
| 5,619,365 * | 4/1997 | Rhoads et al. | 359/248 |
| 5,629,951 | 5/1997 | Chang-Hasnain et al. | 372/20 |
| 5,636,059 | 6/1997 | Snyder | 372/18 |
| 5,739,945 * | 4/1998 | Tayebati | 359/291 |
| 5,771,253 | 6/1998 | Chang-Hasnain et al. | 372/20 |
| 5,905,571 * | 5/1999 | Butler et al. | 356/328 |
| 5,914,553 * | 6/1999 | Adams et al. | 310/309 |

FOREIGN PATENT DOCUMENTS

| | | |
|---|---|---|
| WO 95/13638 | 5/1995 | (WO). |
| WO 98/14807 | 4/1998 | (WO). |

OTHER PUBLICATIONS

Timothy Day et al., Laser & Optronics, "Continuously Tunable Diode Lasers", pp. 15–17, Jun. 1993.

Xiang Zhu et al., "Liquid Detection With InGaAsP Semiconductor Lasers Having Multiple Short External Cavities", Applied Optics, vol. 35, No. 24, pp. 4689–4693, Aug. 1996.

Y. Uenishi et al., "Tunable Laser Diode Using a Nickel Micromachined External Mirror", Electronics Letters, vol. 32, No. 13, pp. 1207–1208, Jun. 1996.

* cited by examiner

*Primary Examiner*—Leon Scott, Jr.
(74) *Attorney, Agent, or Firm*—Young & Thompson

(57) ABSTRACT

The invention relates to a wavelength-tunable laser configuration. The interspace between a laser source (200) and a control element (202), forming an external cavity, is short and has a length of preferably at most a few hundreds of wavelengths of the laser source (200). Also, the control element (202) is electrically tunable, which means that the control element (202) changes the optical properties of the external cavity with a movement of at least one tuning part (206, 402).

16 Claims, 4 Drawing Sheets

WAVELENGTH-TUNABLE LASER CONFIGURATION

FIELD OF THE INVENTION

The present invention relates to a wavelength-tunable diode laser. More specifically, the invention relates to a laser configuration with a wavelength-tunable output, the configuration comprising a laser source and a control element, the interspace between the laser source and the control element forming an external cavity, and the control element being arranged to change the optical properties of the external cavity.

BACKGROUND OF THE INVENTION

Wavelength-tunable lasers can be used in several applications including telecommunications and spectroscopy. The wavelength of a diode laser is usually tuned by changing the temperature and/or the electric current passing through the diode. However, the effect of the temperature and the control current on the laser wavelength is small, wherefore the aforementioned manners of tuning the wavelength of the laser are not suitable in applications that require a tuning range of several nanometers.

The wavelength of a diode laser can be changed reliably by using with the laser a separate, external cavity. The prior art comprises two widely used cavity arrangements: the Littman/Metcalf and the Littrow configurations that are disclosed in Lasers & Optronics, *Continuously Tunable Diode Lasers*, pp 15–17, June 1993, which is incorporated herein by reference. In both arrangements, radiation from a diode laser is collimated with a lens and directed at a grating, from which at least some of the radiation is reflected back to the laser either directly or via a mirror. In the Littrow configuration, the wavelength of a diode laser is tuned by changing the angle of the grating, for example. In the Littman/Metcalf arrangement, the wavelength of a diode laser is altered by changing the angle of the mirror.

Since adjusting the position of the mirror or the grating requires great accuracy in the Littman/Metcalf and the Littrow configurations, it is difficult to provide a desired wavelength in the prior art arrangements. They also require exact optical alignment of several components with respect to each other in the manufacturing stage of the configuration, which is difficult to achieve at least industrially and which also increases the price. Further, great demands for accuracy also decrease the durability and reliability of the configuration. Also, such prior art laser configurations are too large for many applications, since the length of the required cavity may be even several tens of centimeters.

The wavelength of a diode laser can also be tuned in a laboratory by placing in front of the laser a glass plate which operates as a dichroic mirror, and behind the laser a movable mirror. The distance of the glass plate from the laser is about 150 $\mu$m and the distance of the rear mirror is about 20 $\mu$m. The distance of the rear mirror can be altered piezoelectrically in this arrangement, which also results in a change in the laser wavelength. Such an arrangement is described in more detail by Zhu, X. & Cassidy, D. T. 1996, *Liquid detection with InGaAsP semiconductor lasers having multiple short external cavities,* Applied Optics, vol 35, no 23, pp 4689–4693, which is incorporated herein by reference. A problem with this arrangement is that the alignment of both the glass plate and the movable mirror requires a great number of components, which means that the structure cannot be integrated into one laser module in this form. Another known arrangement is a structure based on one movable mirror and integrated onto a common optical bench. This arrangement is described in more detail in *Tunable laser diode using a nickel micromachined external mirror* by Uenishi, Y., Honma, K. & Nagaoka, S. 1996, Electronics Letters, vol 32, no 13, pp 1207–1208, which is incorporated herein by reference. However, a problem in utilizing such an arrangement industrially is that optical benches provided with movable micromirrors are not commercially available, wherefore the arrangement cannot be utilized industrially yet. Other problems of the aforementioned arrangements, which are still at the laboratory stage, concern durability and reliability.

BRIEF DESCRIPTION OF THE INVENTION

The purpose of the present invention is to implement a laser configuration such that the aforementioned problems can be solved.

This is achieved with a laser configuration of the type described in the introduction, characterized in that the interspace between the laser source and the control element, forming the external cavity, is short, preferably from zero to hundreds of wavelengths of the laser source, and the control element is electrically tunable, so that the control element changes the optical properties of the external cavity with a movement of at least one tuning part.

The laser configuration according to the invention provides several advantages. A wavelength-tunable laser configuration can be made smaller, simpler and less expensive than the prior art arrangements. Further, there is no need for optical alignments which are essential in the prior arrangements and which require a great deal of accuracy. This makes it essentially easier to manufacture a laser configuration industrially and it also enables production of portable devices due to the small size, light weight and stability. The laser configuration according to the invention is also electrically tunable, which is necessary for example in applications controlled by a processor. In all, the laser configuration according to the invention is inexpensive, small, durable, reliable and has a long service life.

BRIEF DESCRIPTION OF THE DRAWINGS

The invention will be described below in more detail in connection with preferred embodiments and with reference to the accompanying drawings, in which.

DETAILED DESCRIPTION OF THE INVENTION

The arrangement according to the invention is applicable, for example, in optical telecommunication technology, fiber optical sensors, optical data storage and in spectroscopy, without restricting the invention thereto, however.

Figure 1:
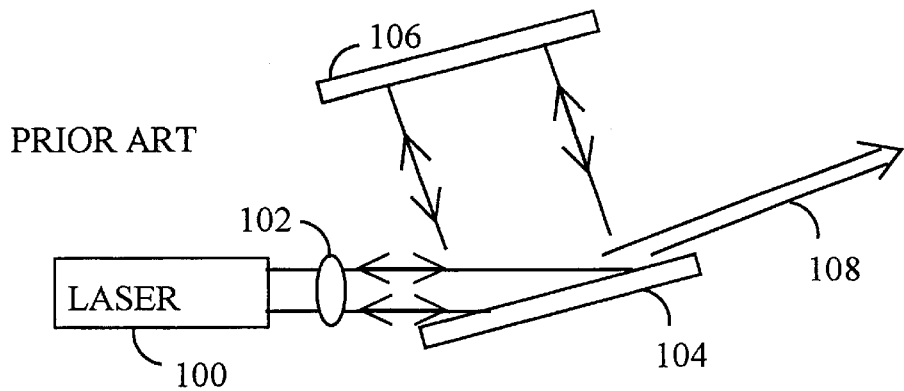
FIG. 1 shows a prior art tunable diode laser.

Examine first a prior art arrangement by means of FIG. 1. A Littman/Metcalf type laser configuration comprises a laser source 100, a lens 102, a grating 104 and a mirror 106. Optical radiation emitted by the laser source 100 is collimated with the lens 102. The collimated radiation then hits the grating 104, from which the radiation 108 is directed outside the laser configuration. However, the grating 104 diffracts a part of the radiation to the mirror 106, from which the optical radiation is reflected back to the grating 104 and from there back to the laser source 100 via the lens 102. The interspace between the laser source 100 and the mirror 106 operates as an external cavity of the laser source 100, which affects the wavelength and power of the radiation 108 originating from the laser source 100. When the optical properties of the cavity are changed by turning the mirror 106, for example, the wavelength of the radiation originating from the laser source 100 can be altered. In such a configuration, the optical alignments are very accurate, which makes the assembly a very demanding task. The configuration is also too large for many applications since the length of the external cavity is usually tens of centimeters. Turning of the mirror also requires accurate mechanics.

Figure 2A:
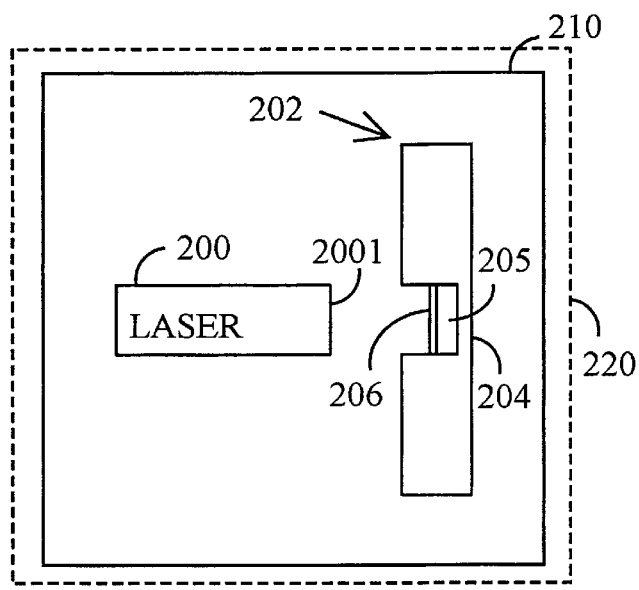
FIG. 2A shows a tunable laser module according to the invention.

FIG. 2A shows a laser configuration according to the invention comprising a laser source 200, a control element 202 and a housing 210. Such a laser configuration constitutes a single laser module 220 according to the invention, which can be used to form linear and/or matrix structures (shown in FIG. 5). The control element 202 is preferably a Fabry-Perot interferometer. The Fabry-Perot interferometer comprises a substrate 204, which operates as a dichroic mirror. The Fabry-Perot interferometer comprises a tuning part 206 which consists of an electrostatically movable mirror that is also dichroic. The control element 202 of the arrangement according to the invention controls the wavelength of the radiation emitted by the laser configuration. In this arrangement, the interspace between the laser source 200 and the control element 202, forming an external cavity, is very short, geometrically straight and comprises no component, such as a lens or mirror, that would refract, reflect or otherwise optically modify the beam. This makes the laser configuration small and enables the manufacture of new type of devices. In the present arrangement, the laser source 200 is preferably a diode laser having a monochromatic wavelength typically in the area of visible light or infrared light. Both the laser source 200 and the control element 202 are preferably packed into an integrated laser module forming a single unit. For this purpose, each component is packed into a housing 210 the structure or form of which is not essential per se to the invention, but the housing and the integration can be implemented in any manner that is evident for a person skilled in the art. The external cavity of the laser source 200 consists of the interspace between a front mirror 2001 of the laser source 200 and the Fabry-Perot interferometer. When the distance between the mirrors 204 and 206 is changed electrostatically, in other words when the length of an internal cavity 205 of the Fabry-Perot interferometer is altered, the wavelength of the passband of the interferometer 202 also changes. This, in turn, changes the properties of the external cavity in the laser configuration, particularly the reflectivity, and thus the wavelength of the laser source 200. In the arrangement shown in FIG. 2A, the radiation from the laser module is emitted from the front and/or the back of the laser source 200.

Figure 2B:
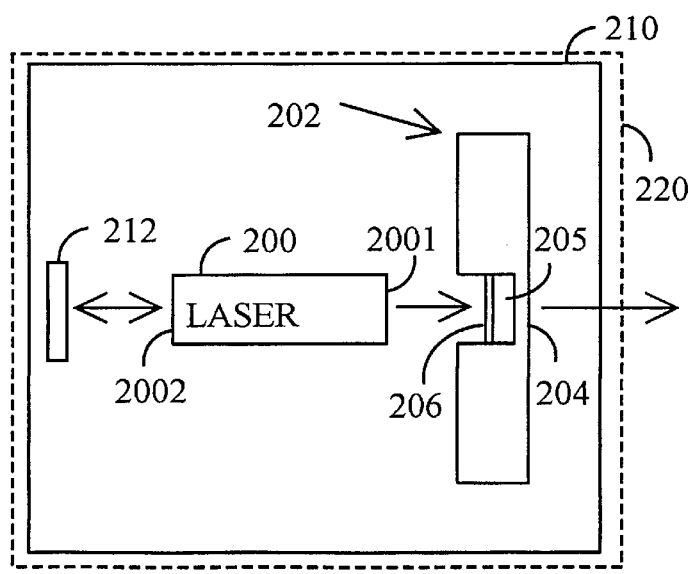
FIG. 2B shows a tunable laser module according to the invention in connection with a rear mirror.

FIG. 2B shows a preferred embodiment of the invention where a mirror 212 is placed behind the laser source 200. In other respects, the arrangement corresponds to the one shown in FIG. 2A. In this case, between a rear mirror 2002 of the laser source 200 and the mirror 212 situated behind the laser source there is formed an external cavity, which can be used to adjust the wavelength and coherence of the laser emission. The mirror 212 situated behind the laser source may reflect the radiation completely or partly. In the arrangement shown in FIG. 2B, the radiation from the laser module is emitted from the front and/or the back of the laser source 200.

Figure 2C:
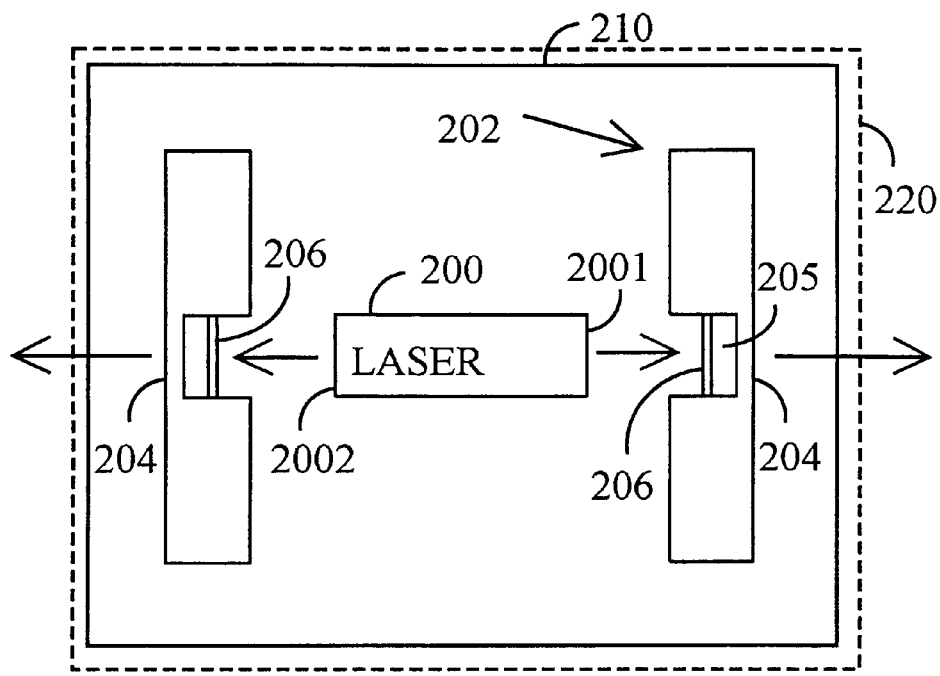
FIG. 2C shows a tunable laser module according to the invention in connection with two control elements.

FIG. 2C shows a preferred embodiment of the arrangement according to the invention where control elements 202 are provided on each side of the laser source 200. In other respects, the arrangement corresponds to the one shown in FIG. 2A. In this case, the laser module comprises two external cavities: the first one is situated between the rear mirror 2002 of the laser source 200 and the control element 202, and the second one is positioned between the front mirror 2001 of the laser source 200 and the control element 202. In this arrangement, the radiation from the laser module is emitted from the front and/or the back of the laser source 200.

In the arrangements according to the invention shown in FIGS. 2A, 2B and 2C, the distance between the diode laser 200 and the control element 202 is only a few tens of micrometers, for example 25 $\mu$m. The laser module is a so-called ESEC (extremely-short-external-cavity) laser. The diode laser 200, in turn, operates at a wavelength of about one micrometer, for example. Thus in the arrangement according to the invention, the laser source 200 may be, for example, a quantum-well InGaAs/GaInAsP/GaInP high-power laser that operates at a wavelength of about 980 nm.

Figure 2D:
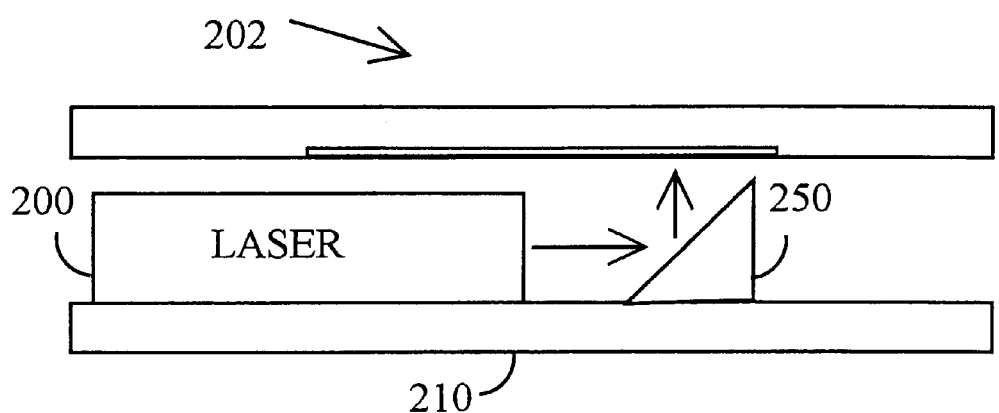
FIG. 2D shows a tunable laser module according to the invention in connection with a mirror placed in a cavity.

FIG. 2D shows an arrangement according to the invention utilizing an intra-cavity mirror 250 situated in the external cavity and placed preferably at an angle of 45° with respect to the direction of the radiation from the laser source 200. Also in this embodiment, the distance between the laser source 200 and the control element 202 can be kept very short.

Therefore, in the arrangement according to the invention the distance between the laser source 200 and the control element 202, in other words the length of the external cavity, is usually a few tens of wavelengths of the laser source 200 in all the embodiments. However, the distance may be anything from zero to at least hundreds of wavelengths. In the arrangement according to the invention, the control element 202 may be placed at the front and/or the back of the diode laser source 200, and the laser radiation is emitted either from the front or the back of the laser source 200.

Figure 3:
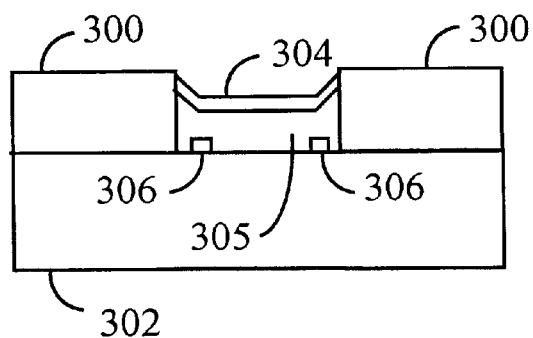
FIG. 3 shows a micromachined Fabry-Perot interferometer.

FIG. 3 shows a Fabry-Perot interferometer according to the invention in more detail. The Fabry-Perot interferometer comprises a layer 300 determining the length of the cavity in the interferometer, a substrate 302, a tunable mirror 304 and a ring electrode 306. The Fabry-Perot interferometer according to the invention is silicon surface micromachined in a known manner, and therefore the substrate 302 is preferably made of silicon. When a voltage is applied between the mirrors 302 and 304 by means of the electrode 306, the mirror 304, which corresponds to the mirror 206 in FIGS. 2A, 2B and 2C, moves towards the substrate mirror 302. The length of the internal cavity 305 of the interferometer can thus be adjusted. The length of the internal cavity 305 of such a silicon surface micromachined Fabry-Perot interferometer is in the range of the laser wavelength, for example 2 $\mu$m. A micromechanical movement of the mirror 304 can be tens of percents of the length of the internal cavity 305 of the interferometer. However, a movement required for tuning the wavelength is typically in the range of the laser wavelength, usually even less than one tenth of the wavelength. The inaccuracy of the movement of the mirror 304 is, for example, less than 20 nm, which makes it possible to move the mirror 304 and to tune the laser wavelength very accurately. In the diode laser configuration according to the invention, such a movement creates, for example, a quasi-continuous tunable wavelength range of at least 4 nm (for instance 980 nm–984 nm) when the spectral bandwidth of the emission is about 0.3 nm FWHM (Full Width Half Maximum). The optical surface of the tunable mirror 304 of the Fabry-Perot interferometer used as the control element 202 usually has a clear aperture having a width of 750 µm, for example. Since the size of the beam of the laser source 200 is for example only 2.5 µm×0.6 µm at the front mirror of the diode laser, it is easy to align the laser beam at the clear aperture of the control element. The Fabry-Perot interferometer used in the arrangement according to the invention is described in more detail also in U.S. Pat. No. 5,561,523, which is incorporated herein by reference.

Figure 4:
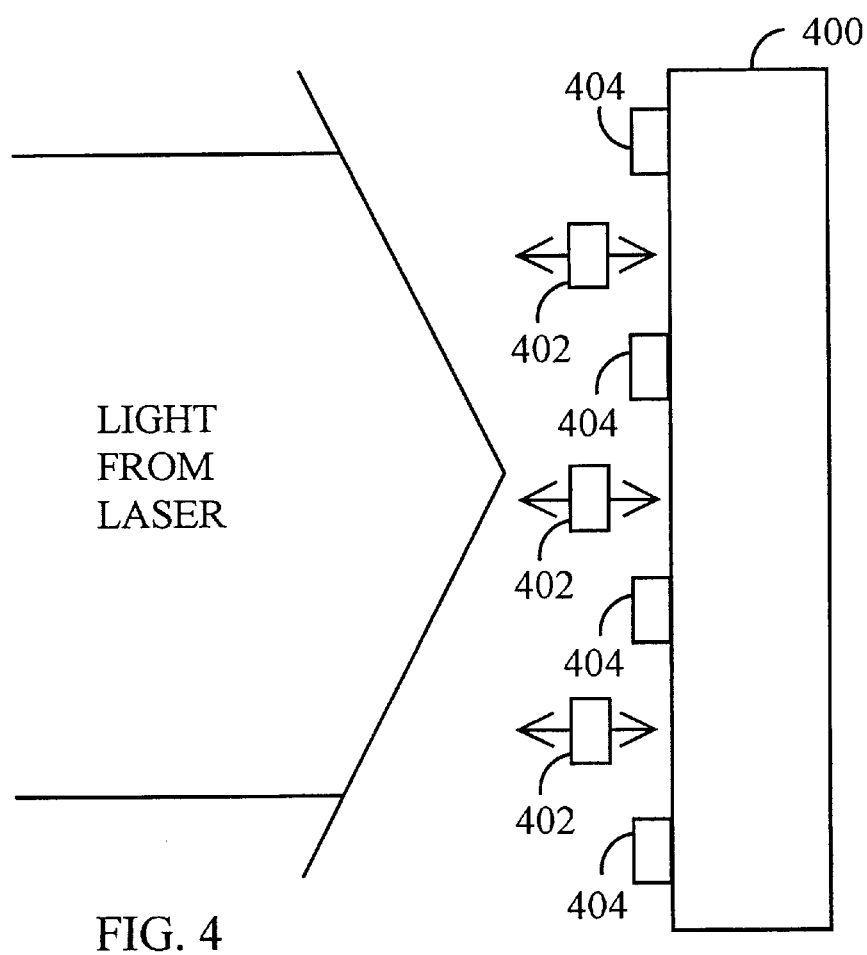
FIG. 4 shows a tunable grating.

FIG. 4 shows a tunable grating which operates as the control element 202 of the inventive arrangement, in other words the grating replaces the Fabry-Perot interferometer. In the same manner as the Fabry-Perot interferometer, the grating is situated in front and/or at the back of the laser source 200 as an integrated structure. The grating consists of a frame 400, which is made of silicon, for example. On the frame 400 there are thin strips 402, 404, which can be moved micromechanically by means of an electrostatic force. The strips are made of, for example, aluminum-coated silicon nitride and they usually have a length of a few dozen micrometers and a width of a few micrometers (depending on the wavelength used). When the strips 402 and 404 are at the same level, the surface reflects substantially all the optical radiation. The strips 402 can be moved in the direction of the normal of the surface by ¼λ, and when the strips are situated furthest from each other, the optical radiation is diffracted from the surface. The operation of the grating is thus adjusted by means of several strips 402 that operate as tuning parts. When the tuning parts 402 are moved, the optical properties of the grating change. Such a change of the optical properties and a slight micromechanical change in the grating also alter the wavelength of the laser source, since the reflectivity of the grating, at least, changes. The grating is preferably electrostatically tunable in the same way as the Fabry-Perot interferometer. One example of the grating described above is a micromechanical structure manufactured by Silicon Light Machines and based on GLV™ (Grating Light Valve™) technology.

Figure 5:
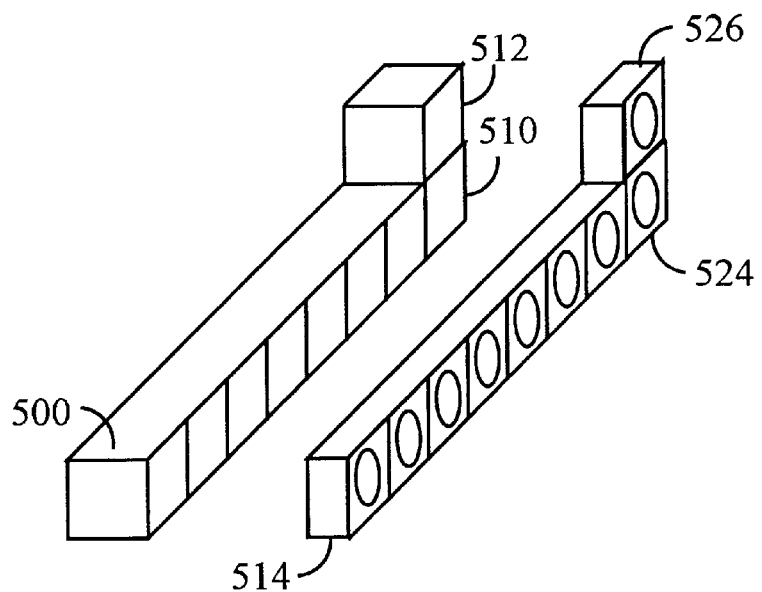
FIG. 5 shows a linear and/or matrix structure of the laser configuration.

FIG. 5 is a general view of connecting the laser modules of the laser configuration in a linear or matrix form. The arrangement comprises laser sources 500–512 and control elements 514–526. The laser sources 500–512 and control elements 514–526 integrated into a linear or matrix form are packaged into one laser module. The laser configuration may comprise only an array laser module which has more than one laser source/control element in a line. On the other hand, a matrix in the laser configuration according to the invention may also comprise N×M laser sources/control elements, where N and M are equal or different integers N, M ∈[2, . . . , ∞]. In this arrangement, each laser element can be tuned to emit its own wavelength, such that in front of each laser source there is a control element of the same form and size which comprises for example Fabry-Perot interferometers in corresponding places with the laser sources. When the integrated laser array or matrix is manufactured in the same semiconductor manufacturing process, the variation in the wavelength of the laser elements is typically only a few nanometers. It is difficult to tune a wavelength emitted by a single laser element to a desired level. However, by means of the arrangement shown in FIG. 5 it is possible to tune the wavelength of each laser element to a desired level by changing the properties of each control element placed in the external cavity. This type of configuration is useful for example in WDM (Wavelength Division Multiplexing) systems where it is necessary to tune the wavelength of individual diode laser sources to a desired level typically at intervals of about 0.8 nm. Correspondingly, the configuration is advantageous in reading or writing of multilayer-storage optical data storage discs (CDs). The configuration can also be utilized in spectroscopy.

Figure 6:
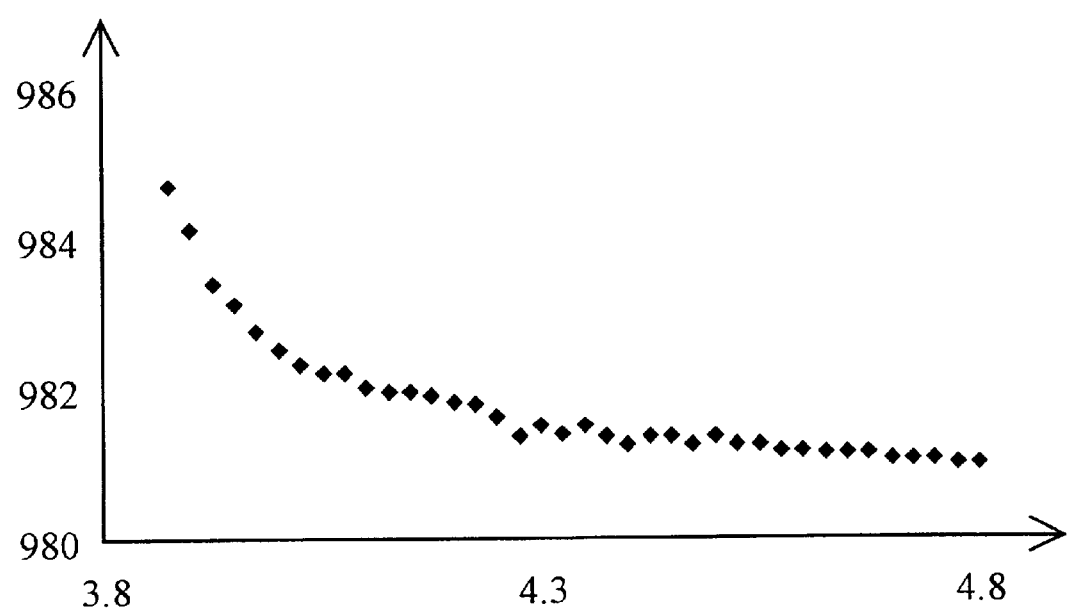
FIG. 6 shows the wavelength of the laser module as a function of the control voltage of the micromachined Fabry-Perot interferometer.

FIG. 6 shows the continuously changing wavelength of the emission of the laser module when the control voltage of the Fabry-Perot interferometer operating as a control element is changed. The wavelength changes at most 3.7 nm (984.7 nm . . . 981 nm) in this experiment when the control voltage of the Fabry-Perot interferometer changes from 3.875 V to 4.8 V.

What is essential in the invention is the fact that the position of the tuning element and the diode laser is fixed and the external cavity characteristics are changed by a kind of micromechanical means.

Even though the invention is described above with reference to an example according to the accompanying drawings, it is clear that the invention is not restricted thereto but it can be modified in several ways within the scope of the inventive idea disclosed in the appended claims.

The invention claimed is:

1. A laser configuration with a wavelength-tunable output, the configuration comprising:
    a laser source; and
    a control element comprising a main portion and a tuning component disposed on the main portion, the control element being separated by an interspace from the laser source so that the interspace forms an external cavity,
    wherein the main portion of the control element is in a fixed position with respect to the laser source, the tuning component being controllably movable with respect to the main portion to tune a wavelength of light emitted by the laser source, the tuning component being controllably moveable through application of a voltage.

2. A laser configuration as claimed in claim 1, wherein the external cavity does not include any component modifying the light emitted by the laser source.

3. A laser configuration as claimed in claim 1, wherein the control element is a Fabry-Perot interferometer.

4. A laser configuration as claimed in claim 3, wherein the control element is a micromachined Fabry-Perot interferometer, which is electrostatically tunable.

5. A laser configuration as claimed in claim 3, wherein the control element comprises an internal cavity, and the Fabry-Perot interferometer changes the light emitted by the laser source through micromechanical movement of the tuning component.

6. A laser configuration as claimed in claim 1, wherein the control element is a tunable grating.

7. A laser configuration as claimed in claim 6, wherein the control element changes the wavelength through micromechanical movement of the tuning component by an amount smaller than the wavelength of the laser source.

8. A laser configuration as claimed in claim 6, wherein the grating is electrostatically tunable.

9. A laser configuration as claimed in claim 1, further comprising an intra-cavity mirror in the external cavity between the laser source and the control element.

10. A laser configuration as claimed in claim 1, wherein the laser source and the control element are packaged into an integrated laser module.

11. A laser configuration as claimed in claim 10, wherein the laser configuration comprises a plurality of integrated laser sources and control elements.

12. A laser configuration as claimed in claim 11, wherein the plurality of laser sources and control elements are integrated into a linear or matrix module.

13. A laser configuration as claimed in claim 1, further comprising a second external cavity and a second control element on an opposite side of the laser source.

14. A laser configuration as claimed in claim 1, wherein the laser module is arranged to radiate in both directions.

15. A laser configuration as claimed in claim 1, wherein the laser module is arranged to radiate in one direction.

16. A laser configuration as claimed in claim 1, further comprising a second external cavity and a mirror at an end of the second external cavity so that the laser source is located between the mirror and the control element.

* * * * *